(12) United States Patent
Fung

(10) Patent No.: US 6,774,415 B2
(45) Date of Patent: Aug. 10, 2004

(54) METHOD AND STRUCTURE FOR ULTRA-THIN FILM SOI ISOLATION

(75) Inventor: Ka Hing Fung, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/336,109

(22) Filed: Jan. 2, 2003

(65) Prior Publication Data

US 2004/0130006 A1 Jul. 8, 2004

(51) Int. Cl.⁷ .................. H01L 27/148; H01L 29/768
(52) U.S. Cl. ............................ 257/244; 257/640
(58) Field of Search ....................... 257/244, 374, 257/386, 640

(56) References Cited

U.S. PATENT DOCUMENTS

| | | | |
|---|---|---|---|
| 5,236,862 A | * | 8/1993 | Pfiester et al. |
| 5,914,523 A | * | 6/1999 | Bashir et al. |
| 6,303,413 B1 | * | 10/2001 | Kalnitsky et al. |
| 6,424,019 B1 | | 7/2002 | Hsia et al. .................. 257/499 |
| 6,429,084 B1 | | 8/2002 | Park et al. .................. 438/305 |
| 6,437,400 B2 | | 8/2002 | Leobandung ............... 257/329 |
| 6,444,539 B1 | | 9/2002 | Sun et al. ................... 438/424 |
| 2002/0145174 A1 | | 10/2002 | Aipperspach et al. ....... 257/510 |

OTHER PUBLICATIONS

Robert Richmond, Silicon–On–Insulator Technology, Nov. 8, 2000, at http://www.sysopt.com/articles/soi/index.html: p. 1.
Robert Richmond, Silicon–On–Insulator Technology, Nov. 8, 2000, at http://www.syopt.com/articles/soi/index2.html: p. 2.
Robert Richmond, Silicon–On–Insulator Technology, Nov. 8, 2000, at http://www.sysopt.com/articles/soi/index3.html: p. 3.
Robert Richmond, Silicon–On–Insulator Technology, Nov. 8, 2000, at http://www.sysopt.com/articles/soi/index4.html: p. 4.

* cited by examiner

*Primary Examiner*—Phuc T. Dang
(74) *Attorney, Agent, or Firm*—Lisa Ulrich; Cantor Colburn LLP

(57) ABSTRACT

A method and structure for fabricating isolation regions on a silicon on insulator (SOI) substrate, wherein the SOI substrate comprises a buried oxide layer and a silicon layer disposed on the buried oxide layer, wherein the silicon layer is less than about 20 nanometers. The method and structure includes a nitride liner layer conformally deposited in the isolation regions.

6 Claims, 4 Drawing Sheets

METHOD AND STRUCTURE FOR ULTRA-THIN FILM SOI ISOLATION

BACKGROUND

The present disclosure relates generally to the manufacture of integrated circuit devices and, more particularly, to a method and structure for ultra-thin silicon-on-insulator isolation.

As the current integrated circuit (IC) technology moves to smaller feature sizes and the density of IC features in an IC substrate surface increases, shallow trench isolation (STI) processes are replacing local oxidation of silicon (LOCOS) isolation methods as the processes of choice for isolating active areas in semiconductor circuits. LOCOS methods are generally undesirable at sub-0.5 micron design rules because they typically introduce non-planarity and a so-called bird's beak at the edge of an active area, which reduces the packing density of the circuitry. In contrast, STI process provide isolation schemes that produce a relatively high degree of planarity and eliminate the bird's beak problems.

As shown in FIGS. 1–3, a conventional STI process generally includes a native oxide layer 12, e.g., silicon dioxide, that is blanket deposited onto a surface of an IC substrate. A polishing stop layer 14, e.g., silicon nitride ($Si_3N_4$) is then blanket deposited onto the native oxide layer 12. The polishing stop layer 14 and the native oxide layer 12 are etched through using conventional lithography well known to those skilled in the art to form trenches 16, 18, and 20 in the IC substrate. Trench 16 is formed in a wide open area and trenches 18, 20 are formed in a dense area of IC substrate 10. As shown, the dense area has a greater number of trenches per unit area of the IC substrate than the wide open area. Those skilled in the art will also recognize that the trenches 16 in the wide open area are also wider than the trenches 18, 20 in the dense area.

An insulating layer 22, e.g., an oxide, is then deposited onto the IC substrate 10 and fills the trenches 16, 18, and 20. As such, subsequently formed active areas are electrically isolated from one another. Deposition is typically effected by chemical vapor deposition or through the use of spin-on glasses. IC substrate 10 is then subjected to a chemical mechanical polishing process (CMP) to remove the insulating layer 22 and polish stop layer 14. CMP typically includes mounting an IC substrate face down on a holder and rotating the IC substrate face against a polishing pad mounted on a platen, which also rotates. During oxide CMP, a slurry composition, e.g., hydrogen peroxide, is introduced between the polishing pad and the IC substrate surface or on the polishing pad near the IC substrate surface to remove insulating layer 22. The presence of the polishing stop layer insures that after CMP oxide has concluded, an appropriate thickness of native oxide layer 14 is maintained above the substrate, which has a significant impact on performance characteristics of an IC As shown in FIG. 3, after oxide CMP is finished and the polishing stop layer 14 is removed, isolation structures (i.e., trenches 16, 18, and 20 filled with insulating material 22) are formed in the IC substrate, the native oxide layer 12 with the appropriate thickness is maintained above the IC substrate, and the substantially planar surface of insulating layer 22 above trenches 16, 18, and 20 is preserved.

Thus, in conventional STI processing, the isolation is performed prior to the gate process. Moreover, a degree of dishing may occur in trench 16 resulting in a concave section, which may provide an electrically conductive pathway leading to undesirable electrical leakage. In addition, a preclean step that is typically employed prior to epi growth can overreach then shallow trench isolation fill and expose silicon during the subsequent epi growth step. With this unwanted epi growth at or near the isolation, there is a potential for shorting across the isolation.

In addition to the use of STI isolation processes, current IC technology is gravitating to the use of a silicon-on-insulator (SOI) substrate. The main advantages of using an SOI substrate include, among others, a marked reduction in the parasitic capacitance, an increase in the switching speed, a greater immunity to noise, less leakage currents, no latch-up of parasitic components, greater resistance to radiation effects, and an increase on the component packaging density. As such, SOI substrates are applicable to fabrication of metal oxide semiconductor field effect transistors (MOSFETs) under the size of 0.1 micron due to its improvement on short channel effects, its intensive tolerance to radiation, associated simple fabrication process, and excellent device isolation properties.

However, as SOI film thickness scales to less than about 20 nanometers, the above noted conventional STI process present problems. For example, the oxide fill between active areas can be deleteriously etched by a subsequent suicide and/or raised source/drain wet cleaning processes. Moreover, poly strapping can occur at the SOI edge, which can cause threshold voltage (Vt) lowering in narrow width devices.

BRIEF SUMMARY

Disclosed herein is a method and structure for fabricating isolation regions on a SOI substrate. The method includes depositing a first oxide layer onto a SOI substrate, wherein the SOI substrate includes a buried oxide layer and a silicon layer disposed on the buried oxide layer, and wherein the silicon layer has a thickness of less than about 20 nanometers; depositing a first polysilicon layer onto the first oxide layer; etching selected portions of the first polysilicon layer, the first oxide layer, and the silicon layer to form isolation regions; depositing a conformal nitride layer onto the substrate; depositing a second oxide layer onto the nitride layer; polishing the substrate to the nitride layer, selectively etching the nitride layer to expose a surface of the polysilicon layer, wherein the isolation regions comprise the nitride layer and the oxide layer; cleaning the exposed surfaces of the polysilicon layer, depositing a second polysilicon layer in contact with the exposed surfaces of the first polysilicon layer.

A semiconductor device structure includes a SOI substrate comprising a buried oxide layer and a silicon layer disposed on the buried oxide layer, wherein the silicon layer has a thickness of less than about 20 nanometers; and an isolation region formed in the silicon layer providing electrical isolation between adjacent active devices formed on the SOI substrate, the isolation region comprising a nitride liner layer in contact with the buried oxide layer and a sidewall defining the active area, wherein the nitride liner layer is at a thickness less than about 50 nanometers.

The above described and other features are exemplified by the following figures and detailed description.

BRIEF DESCRIPTION OF THE DRAWINGS

Referring to the exemplary drawings wherein like elements are numbered alike in the several Figures.

DETAILED DESCRIPTION

Figure 1:
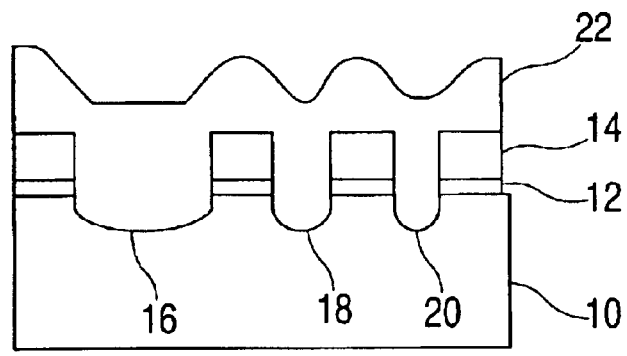
FIGS. 1–3 illustrate a conventional shallow trench isolation process.
Figure 2:
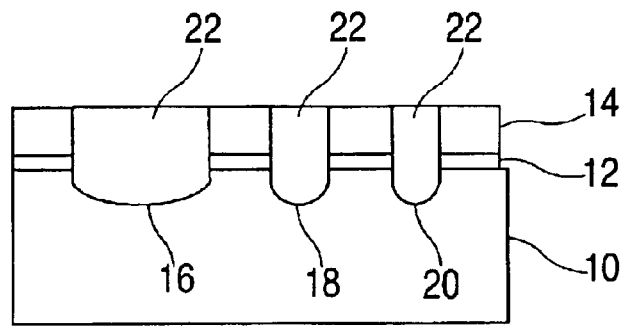
Figure 3:
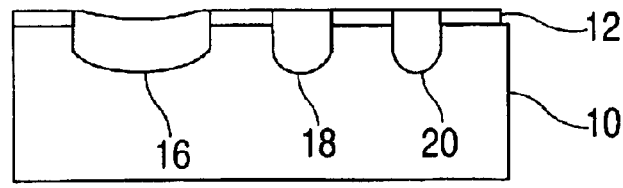
Figure 4:
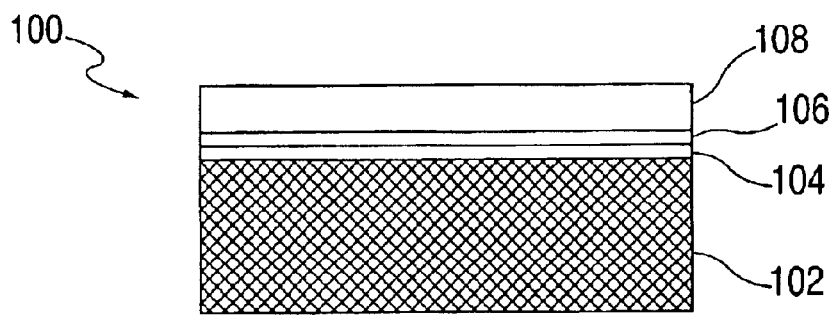
FIG. 4 shows a semiconductor device structure including a SOI substrate with a gate oxide layer and a polysilicon layer deposited thereon.

Referring now to FIG. 4, there is depicted an SOI substrate generally designated 100. The SOI substrate 100 comprises a buried oxide layer 102 and an ultra-thin silicon layer 104. As used herein, the term "ultra-thin silicon layer" refers to a thickness equal to or less than about 20 nanometers, and as such, is suitable for use for the fabrication of IC employing ground rules of less than about 100 nanometers.

The SOI substrate 100 may be formed with a silicon wafer using a process referred to a SIMOX, i.e., a separation by implantation of oxygen process. In this process, the top layer of the silicon wafer is converted to oxide by direct injection of purified oxygen into the silicon wafer at extremely high temperatures forming a silicon oxide film, i.e., a buried oxide layer. An epitaxial layer of silicon is then grown onto the buried oxide layer 102, i.e., ultra-thin silicon layer 104.

A gate oxide layer 106 is blanket deposited onto the silicon layer 104, after which a polysilicon layer 108 is deposited onto the gate oxide layer 106 at a thickness preferably less than about 50 nanometers, with less than 45 nanometers more preferred, and with less than about 30 nanometers even more preferred. The thickness of the gate oxide layer 106 is preferably less than about 40 nanometers, with less than about 30 nanometers more preferred, and with less than about 20 nanometers even more preferred. Optionally, the well implants (not shown) can be performed after this step, or prior to ate oxide formation.

Figure 5:
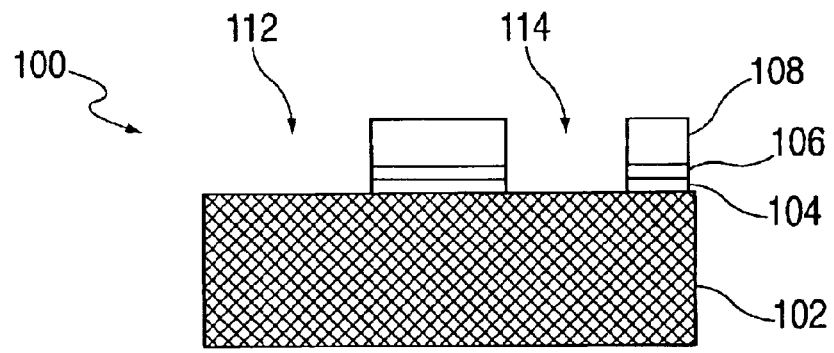
FIG. 5 shows the structure after a directional etch.

As shown in FIG. 5, isolation regions 112, 114, are defined by directional etching through the polysilicon layer 108, the oxide layer 106, and the SOI silicon layer 104, wherein the buried oxide layer 102 acts as the etch stop. Etching includes the use of a masking layer, e.g., a radiation sensitive photoresist layer, deposited onto the substrate, which is defined using conventional lithography, e.g., exposing the masking layer to a radiation source and then developing the masking layer. The masking layer protects those regions of the substrate from etching where circuitry for active areas are subsequently formed. For example, the masking layer is defined above those areas of the substrate where complementary metal oxide semiconductor transistor devices are being fabricated. The isolation regions 112, 114, separate active regions from one another. Isolation region 112 is formed in a wide open area whereas isolation region 114 is formed in a dense area. Those skilled in the art will recognize that the isolation regions in the wide open area, e.g., isolation region 112, are also wider that those isolation regions in the dense areas, e.g. isolation region 114.

Figure 6:
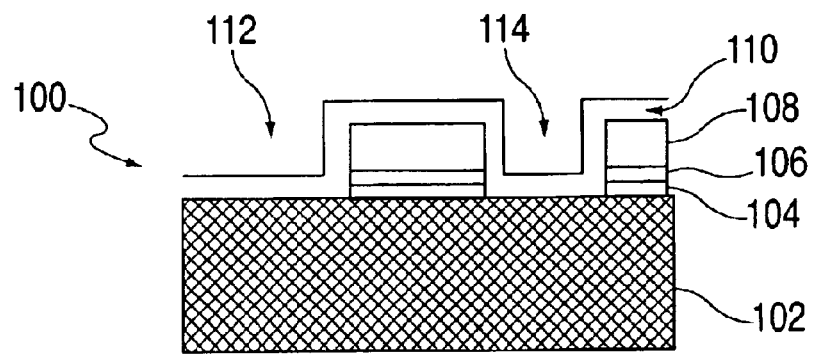
FIG. 6 shows the structure following conformal deposition of a nitride protective layer.

Next, as shown in FIG. 6, a nitride layer 110 is conformally deposited onto the patterned substrate. The nitride layer 110 can comprise silicon, nitrogen, and optionally oxygen. Preferably, the nitride layer is a silicon nitride ($Si_3N_4$), which is deposited at a thickness less than about 50 nanometers, with less than about 40 nanometers more preferred, and with less than about 30 nanometers even more preferred. A common approach used for depositing a conformal film is by way of chemical vapor deposition (CVD). CVD usually provides a conformal film because the process relies on the chemical adsorption of a gas onto the surface. Since chemical adsorption is non directional, the file deposited conforms to the surface. The degree of conformality generally depends on the temperature. For nitride dielectrics such as the preferred silicon nitride film, temperatures greater than about 700° C. are preferred.

Figure 7:
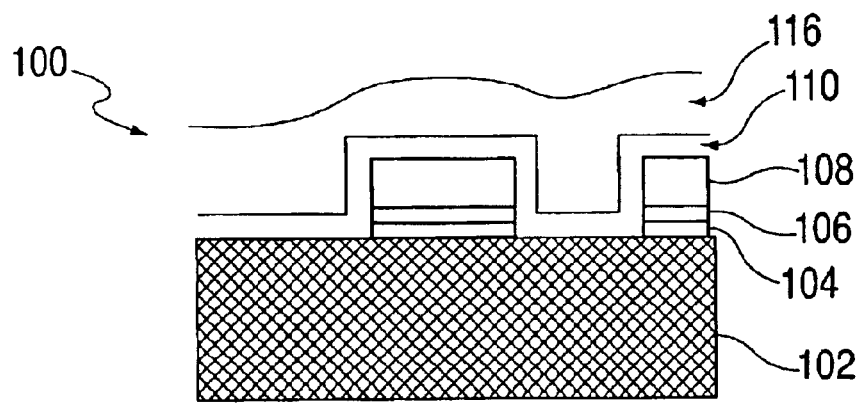
FIG. 7 shows the structure after deposition of an oxide layer to the substrate.
Figure 8:
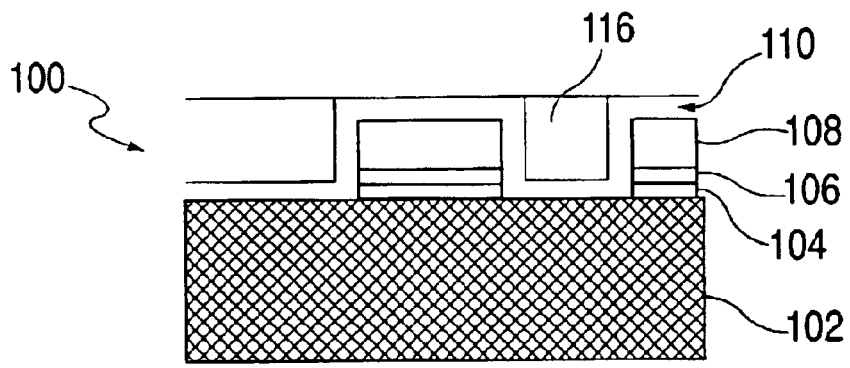
FIG. 8 shows the structure after a chemical mechanical polishing process is applied to the substrate.

FIGS. 7 and 8 illustrate the structure after high density plasma chemical vapor deposition (HDPCVD) of an oxide dielectric film 116 followed by a chemical mechanical polish (CMP) process. The HDPCVD deposition temperature generally ranges from about 200° C. to about 500° C. The CMP process removes excess oxide from the substrate surface with the nitride layer 110 functioning as a polishing stop layer. The resulting structure includes a substantially planar surface with the isolation regions 112, 114 filled with the oxide dielectric film 116.

Figure 9:
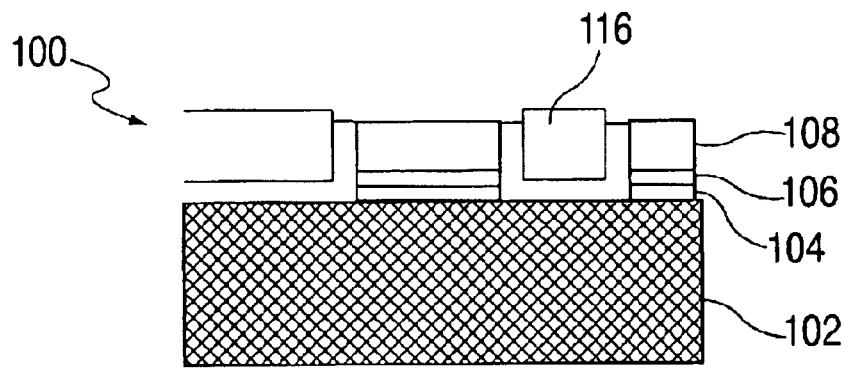
FIG. 9 shows the structure after a nitride reactive ion etching process is applied to the substrate.

Next, as shown in FIG. 9, a reactive ion etch (RIE) process is employed to remove exposed portions of the nitride layer 110 and expose surfaces of the polysilicon layer 108. RIE is a directed, dry, chemical etching process used in IC fabrication in which chemically active ions arc accelerated along electric field lines to meet a substrate perpendicular to the substrate surface. Chemical reactions between the discharge-generated atoms and radicals with the material to be etched occur at the surface, producing volatile species which desorb into the gas, phase and are pumped out of the chamber. The central part of an RIE system is a vacuum chamber containing an electrode to which radio frequency (rf) power (typically at 13.56 megahertz) is capacitively fed using an automatic matching network. The substrate to be etched is placed on the rf-driven electrode. Reactive gases are admitted from a gas manifold using mass flow controllers. Different gases are used to selectively etch different material. A typical RIE process is conducted in the pressure range of about 10 to about 200 mtorr. The process chamber is evacuated to this pressure range using pumps capable of handling the high flow rates of reactive gases.

The RIE process is followed by a wet cleaning process to remove residual oxide on the exposed surfaces of the polysilicon layer 108. One procedure for removing the residual oxides as well as other surface contaminants involves an ex-situ aqueous cleaning process such as the so-called RCA cleaning followed by an hydrofluoric (HF) acid dip. Alternatively, the substrate is exposed to a mixture of HF gas and water vapor. A post cleaning rinsing process with deionized water may then be employed.

A polysilicon layer 120 is then deposited onto the substrate 100 and contacts portions of the exposed polysilicon layer 120. Gate stack lithography and etching may then be continued so as to form the circuit.

Figure 10:
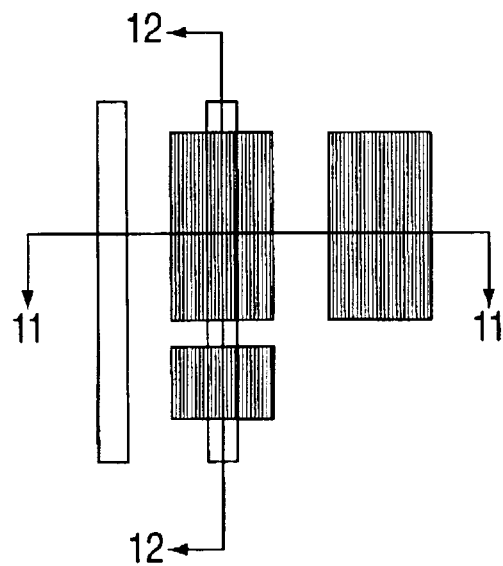
FIG. 10 shows a top plan view of the semiconductor device structure.
Figure 11:
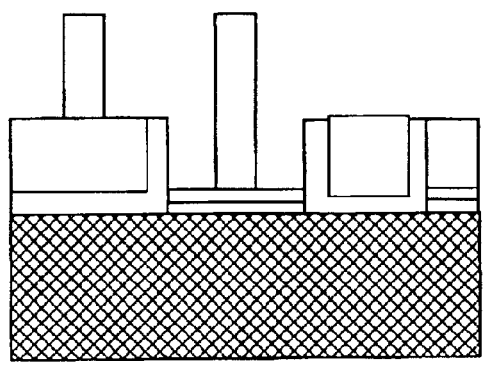
FIG. 11 shows a cross sectional view of the semiconductor device structure taken along lines 11—11 of FIG. 10.
Figure 12:
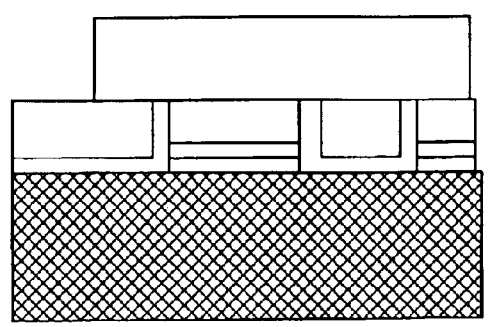
FIG. 12 shows a cross sectional view of the semiconductor device structure taken along lines 12—12 of FIG. 10.

FIG. 10 illustrates a top plan view of the structure in accordance with the previously described process. FIGS. 11–12 illustrate various cross sectional views. From these Figures, it is noted that the structure includes a nitride liner layer 110 as part of the isolation region. Advantageously, the use of the nitride layer as a liner in the isolation regions 112, 114 provides a robust isolation structure that can withstand silicidation and precleaning process chemistries. The nitride layer exhibits a marked increase in selectivity relative to the use of conventional oxides to form the isolation regions. Without the use of the nitride liner, silicidation would consume any exposed silicon in the area. Moreover, poly strapping at the SOI island edge is eliminated since the nitride layer extends to protect this are during subsequent processing. The epi growth process is now limited to growing epi layers only on the source/drain regions since the gate and the isolation regions are now protected by the nitride liner layer 108.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof Therefore, it is intended that the invention not be limited to the particular embodiment disclosed as the best mode contemplated for carrying out this invention, but that the invention will include all embodiments falling within the scope of the appended claims.

What is claimed is:

1. A semiconductor device structure comprising:
    a SOI substrate comprising a buried oxide layer and a silicon layer disposed on the buried oxide layer, wherein the silicon layer has a thickness of less than about 20 nanometers; and
    an isolation region formed in the silicon layer providing electrical isolation between adjacent active devices formed on the SOI substrate, the isolation region comprising a nitride liner layer in contact with the buried oxide layer and a sidewall defining the active area.

2. The semiconductor device structure according to claim 1, wherein the nitride liner layer is at a thickness less than about 50 nanometers.

3. The semiconductor device structure according to claim 1, wherein the isolation region further comprises an oxide layer deposited in a gap formed by the nitride liner layer.

4. The semiconductor device structure according to claim 1, wherein the nitride liner layer is at a thickness less than about 40 nanometers.

5. The semiconductor device structure according to claim 1, wherein the nitride liner layer is at a thickness less than about 30 nanometers.

6. The semiconductor device structure according to claim 1, wherein the nitride comprises $Si_3N_4$.

* * * * *